United States Patent
Waayers et al.

(10) Patent No.: US 8,410,787 B2
(45) Date of Patent: Apr. 2, 2013

(54) TESTING OF AN INTEGRATED CIRCUIT WITH A PLURALITY OF CLOCK DOMAINS

(75) Inventors: Thomas F. Waayers, Sint Michielsgestel (NL); Richard Morren, Waarle (NL)

(73) Assignee: NXP B.V., Eindhoven (NL)

( * ) Notice: Subject to any disclaimer, the term of this patent is extended or adjusted under 35 U.S.C. 154(b) by 963 days.

(21) Appl. No.: 11/816,162

(22) PCT Filed: Feb. 9, 2006

(86) PCT No.: PCT/IB2006/050421
§ 371 (c)(1),
(2), (4) Date: Apr. 1, 2010

(87) PCT Pub. No.: WO2006/085276
PCT Pub. Date: Aug. 17, 2006

(65) Prior Publication Data
US 2010/0188096 A1 Jul. 29, 2010

(30) Foreign Application Priority Data
Feb. 11, 2005 (EP) .................... 05101041

(51) Int. Cl.
*G01R 31/02* (2006.01)
(52) U.S. Cl. ........................................ 324/537
(58) Field of Classification Search .......... None
See application file for complete search history.

(56) References Cited

U.S. PATENT DOCUMENTS

| | | |
|---|---|---|
| 5,909,451 A | 6/1999 | Lach et al. |
| 6,131,173 A | 10/2000 | Meirlevede |
| 6,442,722 B1 | 8/2002 | Nadeau-Dostie et al. |
| 7,398,442 B2 * | 7/2008 | Peeters ................. 714/731 |
| 2002/0011690 A1 | 1/2002 | Tojo et al. |
| 2002/0024352 A1 | 2/2002 | Sim |
| 2003/0023941 A1 | 1/2003 | Wang et al. |

FOREIGN PATENT DOCUMENTS

| | | |
|---|---|---|
| EP | 0 965 850 A1 | 12/1999 |
| JP | 2095284 A | 4/1990 |

* cited by examiner

*Primary Examiner* — Paresh Patel

(57) ABSTRACT

An integrated circuit comprises a plurality of clock domains (10, 12). Test data is shifted into the integrated circuit through a scan chain (100, 14, 104). In a test mode a connection is interrupted between a functional output of a first clock domain (10) and a functional input of a second clock domain (12). Test data is applied from the scan chain (100, 14, 104) to the functional input and a test response is captured into from the functional output. A delay circuit (24, 28) is used to delay transfer of the test result from the scan cell (21) to the functional input when the test result is captured in the scan cell (21), to ensure that timing differences between the clock domains do not affect the test. Subsequently the test result is shifted through the scan chain.

10 Claims, 4 Drawing Sheets

TESTING OF AN INTEGRATED CIRCUIT WITH A PLURALITY OF CLOCK DOMAINS

The invention relates to testing of integrated circuits, and to an integrated circuit that is constructed to facilitate testing.

U.S. Pat. No. 6,131,173 describes an integrated circuit that is constructed to facilitate testing. The integrated circuit contains a normally transparent test circuit block, which has no effect on functional signals during normal functional operation (when no test is performed). Typically such a transparent test circuit block contains a transparency multiplexer that is inserted at a functional circuit node of the integrated circuit. During functional operation, the transparency multiplexer passes functional node signals that arrive at the node to circuits that have inputs connected to the node.

For test purposes, the normally transparent test circuit block contains a scan cell with a flip-flop and a scan multiplexer. The scan multiplexer is located in front of the flip-flop and serves to connect the input of the flip-flop either to the circuit node, or to the output of another scan cell to form a serial shift register for shifting test data into and out of the integrated circuit. The output of the flip-flop is connected to an input of the transparency multiplexer, to substitute test data from the flip-flop for the functional node signals during testing. Normally, such a test circuit block is used to perform a test operation wherein the flip-flop first supplies test data and next captures a response in a single test cycle. In the following the flip-flop will be called the "scan flip-flop". It may be noted that in the art the combination of the flip-flop and the multiplexer is sometimes called "scan flip-flop". This meaning of scan flip-flop should not be confused with the use of the term "scan flip-flop" in the following.

U.S. Pat. No. 6,131,173 describes that problems may arise when such a transparent test circuit block is provided for a node between functional circuits from different clock domains (circuits from different clock domains are clocked by mutually different clock signals during functional operation). In this case the relative timing of functional circuits on different sides of the circuit node is uncertain during testing. As a result it is uncertain whether circuits that receive data from the normally transparent test circuit block will clock in test data that corresponds to data is in the normally transparent test circuit block in one clock cycle or another.

U.S. Pat. No. 6,131,173 describes that this problem can be solved by providing for a hold mode, in which the data in the scan flip-flop is prevented from being updated during testing. When test circuit block is switched to the hold mode the output of the scan flip-flop is coupled to its input. As a result the relative timing of the clock domain no longer matters, since the scan flip-flop outputs the same data both before and after the clock transition.

However, this solution has the effect that the scan flip-flop cannot be used for capturing test data when the circuit is in the hold mode. Hence, the circuit must include more scan flip-flops, or separate test operations are required if a scan flip-flop has to be used both for applying test data and for capturing test data.

Among others, it is an object of the invention to provide for a test prepared integrated circuit that contains different clock domains and a test circuit block that is located between the clock domains and that makes it possible to supply test data and capture test results reliably in a single operation.

The test prepared integrated circuit according to the invention is set forth in Claim 1. According to the invention the integrated circuit is arranged so that a connection for passing data signals between two clock domains can be switched from a transparent state to a state wherein a test result is captured into a scan cell from the first clock domain at the input end of the connection and test data is supplied from the scan cell to a circuit in a second clock domain at the output end of the connection. A delay circuit is added to the scan cell to introduce a delay between the time of capture of the test result and the time that it is passed to the other clock domain after capture. In this way, timing differences between the clock signals of the clock domains do not affect testing.

Preferably, the delay is implemented so that it does not extend the scan chain, i.e. so that no additional clock cycle is needed to shift test data through the delay circuit.

In an embodiment the delay is realized by means of a hold/transparent latch after the output of the scan cell, the latch being kept in hold mode during a time interval starting from capture, so that the latch temporarily holds data from before capture. Preferably, the hold/transparent mode of the latch is controlled to using the clock signal that is used for the scan cell. In this way no additional time constants are introduced by the circuit.

In another embodiment the integrated circuit is arranged so that the latch is permanently transparent during shifting of test data and switched to hold only in the test normal mode during capture of a test result. In this way a longer time interval is realized in which timing variations in the clock domains are immaterial for the test. In another embodiment, the delay is activated both during the test normal mode and the test shift mode. This simplifies the circuit, be it at the expense of less tolerance to timing variations.

Advantageously, the integrated circuit comprises more than two clock domains and data connections between respective pairs clock domains of clock domains contain a normally transparent test circuit blocks with a scan cell, a delay circuit and a transparency multiplexer. This makes it possible to perform a test with many clock domains at the same time using the same form of clock signal for all clock domains.

These and other objects and advantageous aspects will become apparent from the description of exemplary embodiments, using the accompanying figures.

Figure 1:
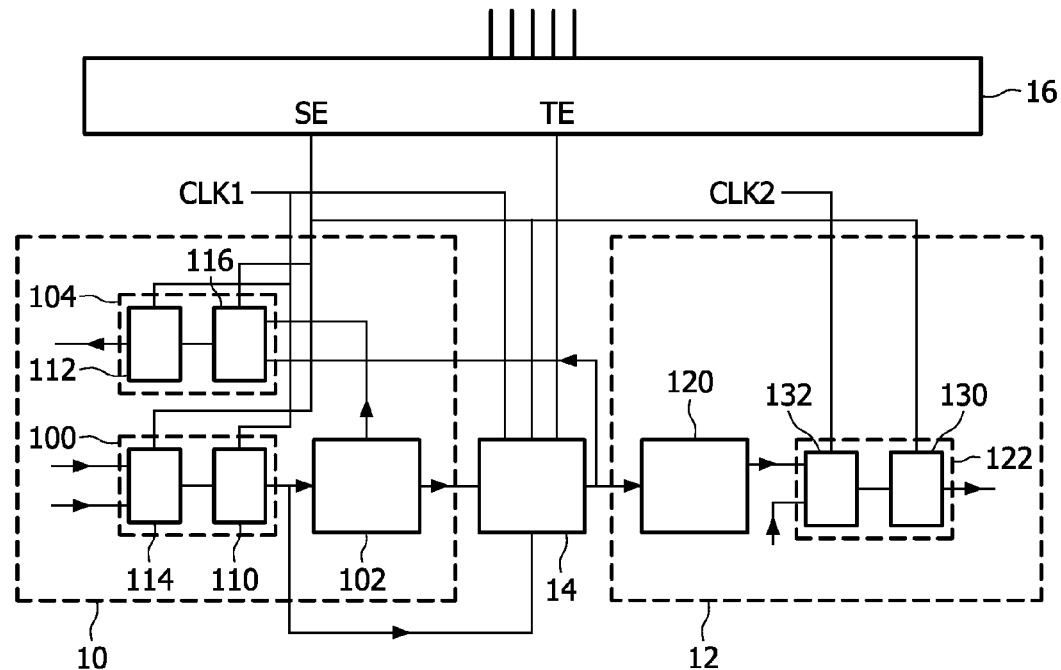
FIG. 1 shows a testable circuit

FIG. 1 shows a testable circuit, comprising a first clock domain 10, a second clock domain 12 a normally transparent test circuit block 14 and a test control circuit 16. First clock domain 10 comprises functional logic circuits 102 and a flip-flops 110, 112, that are part of scan cells 100, 104. The structure of functional logic circuits 110 is not relevant for the invention: any kind of functional logic circuit may be used, such as a combination of logic gates for example.

Each scan cell contains a scan multiplexer 114, 116, with an output coupled to the input of the flip-flop 110, 112 of the scan cell. The flip-flops 110, 112 receive clock signals from a clock input CLK1 of first clock domain 10. Although only one input and two outputs have been shown for logic circuits 102 it should be understood that these logic circuits typically have many more inputs and many more outputs. Likewise, although only two scan cells 100, 104 are shown in first clock domain 10, it should be understood that many more scan cells (not shown) may present with clock inputs coupled clock input CLK1 of first clock domain 10 and inputs and outputs coupled to the outputs and inputs of logic circuits 102. Typically, these scan cells are mutually coupled to form a scan shift register or a plurality of such shift registers.

Second clock domain 12, likewise, comprises functional logic circuits 102 and a scan cell 122 that comprise a scan multiplexer 132 and a flip-flop 130. The flip-flop 130 in second clock domain 12 receives clock signals from a clock input CLK2 of second clock domain 12. Although only one input and one output have been shown for logic circuits 122 it should be understood that these logic circuits typically have many more inputs and many more outputs. Likewise, it should be understood that many more scan cells may present with clock inputs coupled clock input CLK2 of second clock domain 12. Typically these scan cells are connected to form one or more shift register chains.

Normally transparent test circuit block 14 has an input coupled to an output of functional logic circuits 102 of first clock domain 10 and an output coupled to an input of functional logic circuits 120 of second clock domain 12. Normally transparent test circuit block 14 has a clock input coupled to the clock input CLK1 of first clock domain 10. Furthermore, normally transparent test circuit block 14 has a scan input and a scan output coupled to and output and an input of respective scan cells 100, 104 respectively. Thus scan cells 100, 104 in first clock domain and normally transparent test circuit block 14 form a scan chain. Furthermore, normally transparent test circuit block 14 has a transparency control input TE.

Test control circuit 16 has a scan control output coupled to scan control inputs SE of scan multiplexers 114, 116, 132 and normally transparent test circuit block 14. Furthermore test control circuit has a transparency control output coupled to transparency control input TE of normally transparent test circuit block 14. Although not shown, the circuit typically contains at least partly separate clock circuits for supplying clock signals to clock inputs CLK1, CLK2 respectively, and clock multiplexing circuits for causing equal frequency signals that are derived from a common test clock signal to be substituted for the clock signals CLK1, CLK2 at the clock inputs CLK1, CLK2 of clock domains 10, 12 under control of test control circuit 16 during testing. The test clock signals CLK1, CLK2 may be provided from outside the integrated circuit by a test device (not shown). The problem is that the phase relation between these clock signals during testing may be unpredictable, whether they be derived internally in the integrated circuit or supplied externally. In addition the circuit may contain handshake circuitry that is operational during normal operation to handle data transfer between the clock domains while normally transparent test circuit block only provides a transparent connection.

Figure 2:
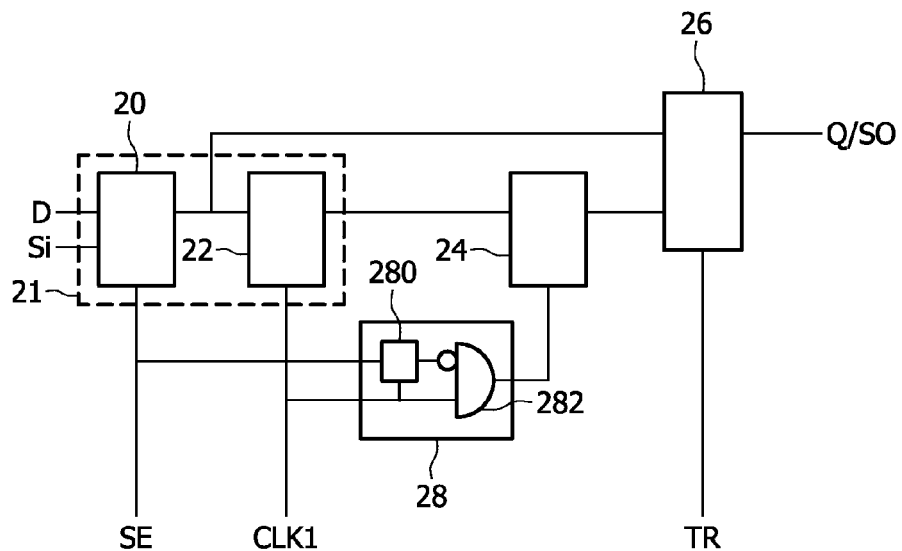
FIG. 2 shows a normally transparent test circuit block

FIG. 2 shows an embodiment of a normally transparent test circuit block 14. This embodiment comprises a scan multiplexer 20, a scan flip-flop 22, a latch 24, a transparency multiplexer 26 and a clock filter circuit 28. Scan multiplexer 20 has multiplexed inputs coupled to a normal data input D and a scan data input Si. Scan multiplexer 20 has a control input that receives the scan enable control signal SE. Scan multiplexer 20 has an output coupled to an input of scan flip-flop 22. Scan flip-flop 22 has a clock input coupled to receive clock signal CLK1 and an output coupled to a data input of latch 24. Thus, scan multiplexer 20 and scan flip-flop 22 together form a scan cell 21. Transparency multiplexer 26 has multiplexed inputs coupled to the output of scan multiplexer 20 and an output of latch 24. Transparency multiplexer 26 has a control input coupled to receive transparency control signal TE. Transparency multiplexer 26 has an output that supplies both output data D and test output data So.

Clock filter circuit 28 has a first and second input coupled to scan enable input SE and clock input CLK1 respectively and an output coupled to a control input of latch 24.

In operation normally transparent test circuit block 14 can be switched to a plurality of different configurations. The normal configuration is that data from input D is passed directly to output Q. To realize this configuration test control circuit 16 applies a control signal scan multiplexer 20 to pass data from input D and to transparency multiplexer 26 to pass data from scan multiplexer 20.

Figure 3:
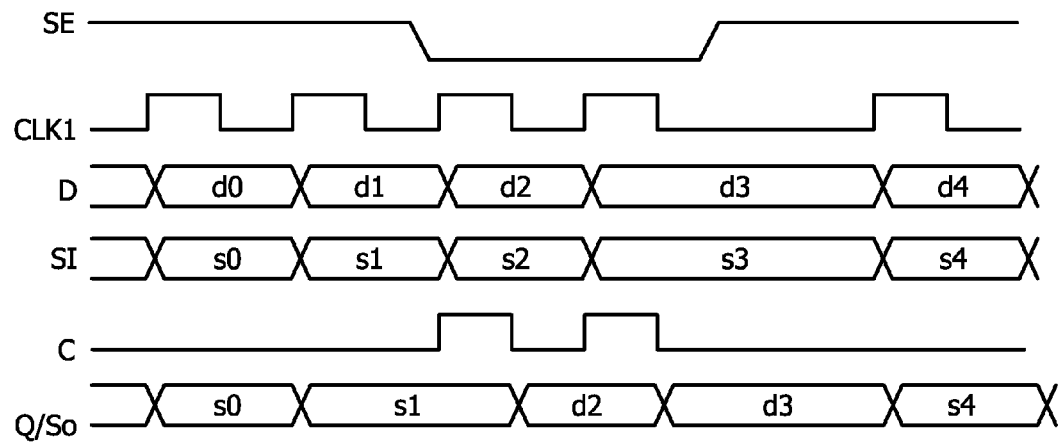
FIG. 3 shows signals during operation of the test circuit block

FIG. 3 illustrates signals involved with testing, including the shift enable signal SE, the clock signal CLK1, the data signal D, the shifted test data signal Si, the control signal C of latch 24 and the output signal Q/So.

During testing test control circuit 16 first switches normally transparent test circuit block 14 to a shift configuration, wherein test data from test input Si is shifted through scan flip-flop to output Q/So. To realize this configuration test control circuit 16 applies a control signal to SE scan multiplexer 20 to pass data from input Si and a control signal TR to transparency multiplexer 26 to pass data from latch 24.

Clock filter circuit 28 serves to keep latch 24 transparent when shifting is enabled (SE logic high). By way of example clock filter circuit 28 contains a filter latch 280 and an AND gate 282. Clock input CLK1 is coupled to a first input of AND gate 282, which has an output coupled to a control input of latch 24. Shift control input SE is coupled to a data input of filter latch 280, and clock input CLK is coupled to an inverting input of filter latch 280. Filter latch 280 has an output coupled to an inverting input of AND gate 282. In operation, while a logic high SE value is stored in filter latch 280 AND gate 282 keeps latch 24 transparent: C is logic low and D follows the output signal of scan flip-flop 22. During the shift configuration test control circuit 16 applies a series of clock pulses to clock input CLK1 to shift test data through the scan chain until test data for normally transparent test circuit block 14 has reached scan flip-flop 22. At this time this test data is output at output D to logic circuit 120.

Next test control circuit 16 switches normally transparent test circuit block 14 to a "test normal" configuration, wherein a test result is captured by scan flip-flop 22. To realize this configuration test control circuit 16 applies a control signal SE to scan multiplexer 20 to pass a test result from logic circuit 102 via input D. At the next active clock transition scan flip-flop 22 captures this test result1. Latch 24 ensures that the captured test result is not immediately passed to transparency multiplexer 26, but with a delay of a part of a clock cycle, from a rising edge to a falling edge (e.g. half a clock cycle if the duty cycle of the clock is 50%). Clock filter circuit 28 ensures that this is done in response to the fact that shift enable signal SE has assumed a level that controls scan multiplexer 20 to pass a test result from logic circuit 102 via input D. Clock filter circuit 28 transmits the clock pulse 30 that follows the transition in shift enable signal SE, and this pulse brings latch 24 into hold mode. Thus, while the clock pulse makes scan flip-flop 22 capture the test result from input D, the clock pulse also makes latch 24 output the data that was output by scan flip-flop 22 before scan flip-flop 22 captured the test result.

In this way the signal at the output D of transparency multiplexer 26 is not affected by the captured test result during the clock pulse that causes scan flip-flop 22 to capture the test result. As a result timing differences between the clocks CLK1 and CLK2 have no effect on test results that depend on the output D and are captured under control of clock CLK2, at least as long as this clock CLK2 is not delayed by more than the delay that is introduced by latch 24 (e.g. half a clock cycle if the duty cycle is 50%) with respect to CLK1.

In the embodiment of FIG. 1 latch 24 remains transparent during normal shift operation. In this way latch 24 does not result in a longer shift register path during shifting. In the embodiment of FIG. 1 selective transmission is realized by the operation of clock filter circuit 28. Filter latch 280 first passes the change in shift enable signal SE and then holds the shift enable signal SE when the clock pulse becomes high. As a result AND gate 282 passes the clock pulse, which puts latch 280 into hold mode during the clock pulse. This continues until SE changes back, after which the output signal of filter latch 280 remains low. When the output signal is low latch 24 is transparent. Although a specific embodiment of clock filter circuit 28 has been shown for this purpose, it should be appreciated that other circuits with the same functionality are possible. Moreover, it should be appreciated that a single clock filter circuit 28 may be shared by a plurality of normally transparent test circuit blocks at outputs of a clock domain 10 that are coupled to circuits one or more other clock domains.

In order to provide a long settling time for shifted data, preferably one clock pulse is suppressed after shift enable signal SE returns to the level that controls scan multiplexer 20 to pass a test result from logic circuit 102 via shift input SI. Suppression may be realized in an external test apparatus that supplies the clock signals during testing, or under control of test control circuit 16. Without suppression of this clock pulse only part of a clock cycle would be available for propagating data from latch 24 through transparency multiplexer 26 and so on to a next scan flip-flop in the scan chain. Of course, when the circuit is sufficiently fast to allow the input signal of this next scan flip-flop to settle in the relevant part of a clock cycle, there is no need to suppress a clock pulse. As another alternative, the clock cycle during which SE changes back to its shift enabling value may be stretched by an amount that is sufficient to allow settling. However, suppression of a clock pulse has the advantage that a steady clock signal can be used.

Figure 4:
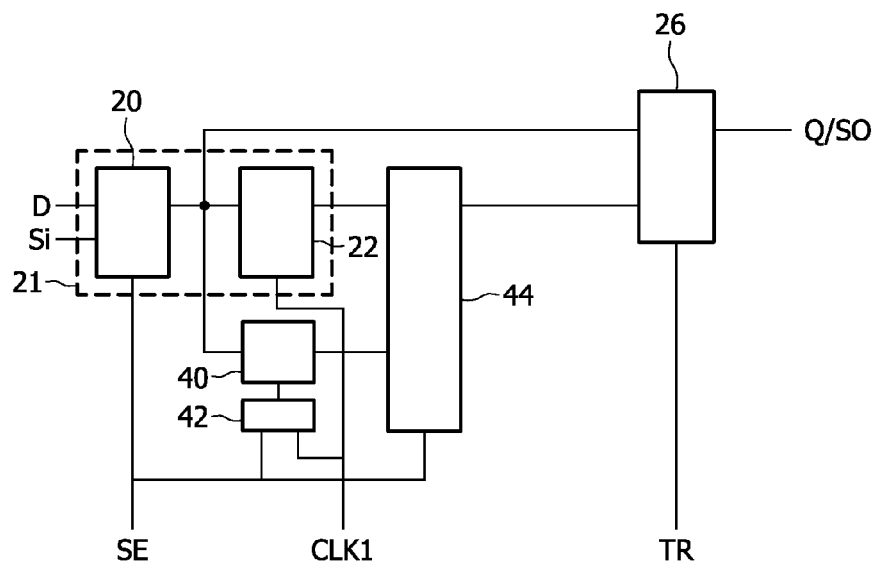
FIG. 4-5 show alternative normally transparent test circuit blocks

FIG. 4 shows an alternative normally transparent test circuit block. In this embodiment an additional flip-flop 40, a clock enable circuit 42 and an additional multiplexer are provided. The inputs of scan flip-flop 22 and additional flip-flop 40 are coupled in parallel and their outputs are coupled to the second input of transparency multiplexer 26 via additional multiplexer. Clock input CLK1 is coupled to a clock input of additional flip-flop 40 via clock enable circuit 42. Shift enable input SE is coupled an enable input of clock enable circuit 42.

In operation, scan flip-flop 22 and additional flip-flop 40 clock in the same test data in the shift mode and data from scan flip-flop 22 is shifted through. In the test normal mode data from additional flip-flop 40 is applied to the output Q/So in the clock cycle wherein a test result is captured in scan flip-flop 22. After switching back of SE a clock cycle is preferably suppressed, or stretched as in the case of the preceding embodiment. As an alternative, clock enable circuit 42 may be coupled to the clock input of scan flip-flop 22. In this case, additional flip-flop 40 is used to capture a test result and used to supply this test result for one cycle after switching back to the test shift configuration.

It should be noted that the circuit of FIG. 4 has the disadvantage that additional flip-flop 40 is not fully tested, because it is not in series with the scan chain. In this respect the circuit of FIG. 2 is more advantageous.

Figure 5:
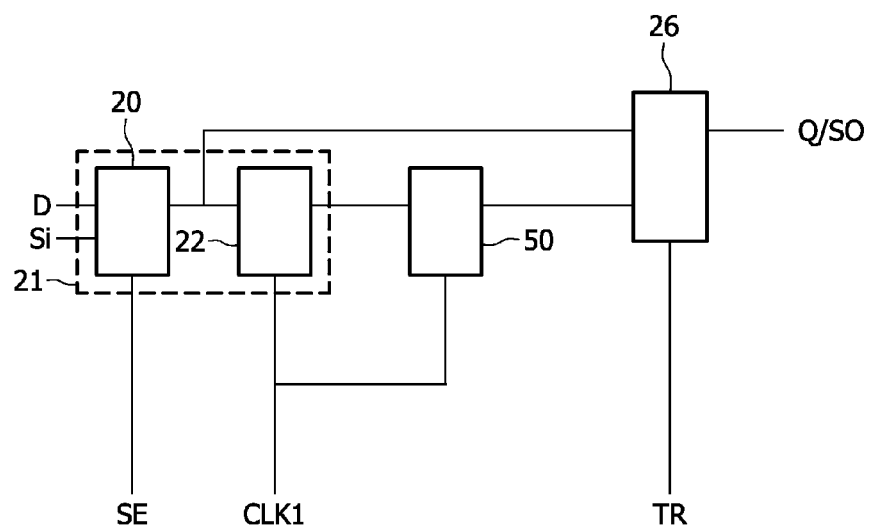

FIG. 5 shows another alternative normally transparent test circuit block, wherein the normally transparent test circuit block contains an additional flip-flop 50 in series with scan flip-flop 22, between scan flip-flop 22 and transparency multiplexer 26. In operation, two copies of the same test data are shifted through the scan chain into scan flip-flop 22 and additional flip-flop 50 before switching to test normal mode. As a result the output signal of additional flip-flop 50 does not change during the clock cycle wherein test results are loaded, so that timing differences between the clock domains have no effect. Compared to the circuit of FIG. 2 this circuit has the disadvantage that it lengthens the scan chain, and therefore the time needed for testing.

Figure 6:
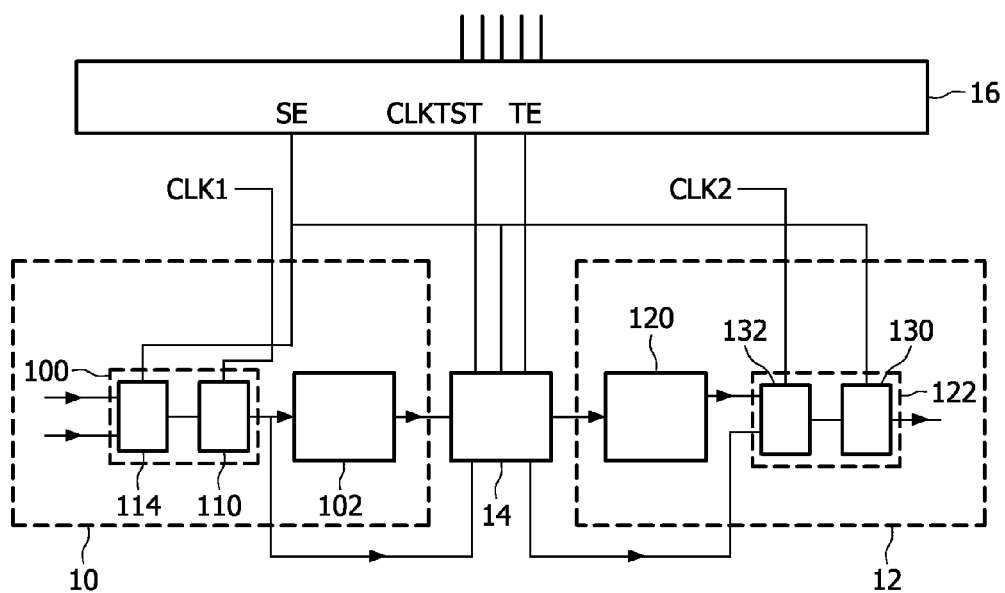
FIG. 6 shows a further testable circuit

FIG. 6 shows a further testable circuit with two clock domains 10, 12. In this circuit, in distinction from the circuit of FIG. 1, the scan chain runs from a scan cell 100 in first clock domain 10 through normally transparent test circuit block 14 to a scan cell 122 in second clock domain 12. In addition, a separate clock signal CLKTST is applied to normally transparent test circuit block 14.

Figure 7:
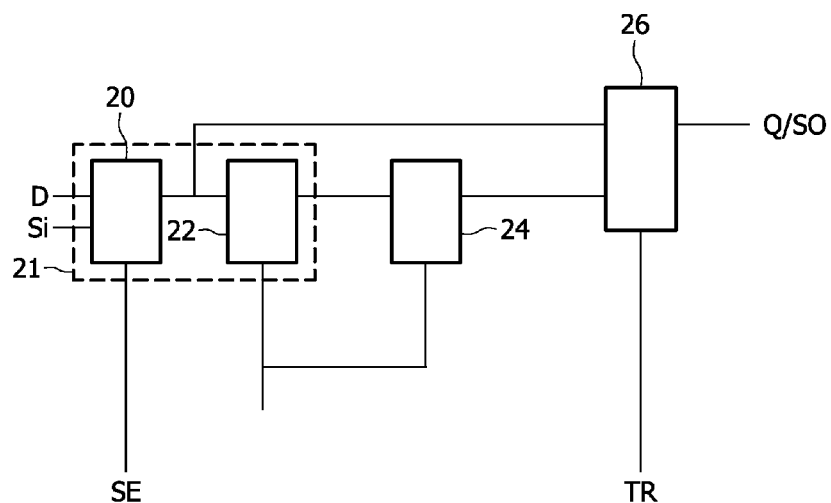
FIG. 7 shows a further normally transparent test circuit block

FIG. 7 shows an embodiment of the normally transparent test circuit block 14 for use in the circuit of FIG. 6. In this embodiment the control input of latch 24 is coupled to clock signal CLK1. In this embodiment latch 24 is switched to hold mode during the part of the clock cycle that follows the clock transition of CLKTST at which scan flip-flop 22 takes over new data.

Figure 8:
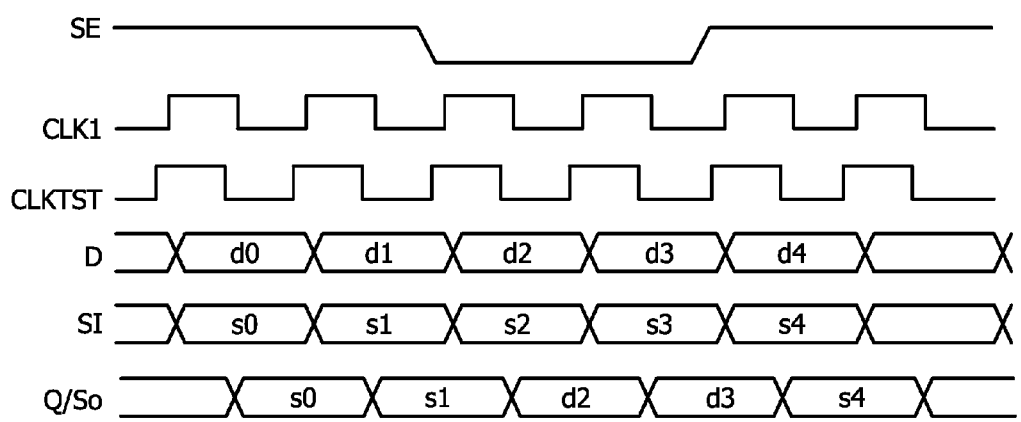
FIG. 8 shows signals during operation of the test circuit block

FIG. 8 shows signals during operation of the circuit block of FIG. 7. The additional clock signal CLKTST has clock transitions in advance of CLK1, but due to the use of latch 24 output of captured data to transparency multiplexer 26 is delayed by part of a clock phase, while latch 24 is kept in hold mode. This enables the scan flip-flop of scan cell 122 in second clock domain 12 to capture a test result that depends on "old" test data, independent of timing differences between the clock signals CLK1, CLK2 of the clock domains. Normally transparent test circuit block 14 bridges these timing differences. During test normal operation normally transparent test circuit block 14 captures test data in advance of a change in output from first clock domain 10, but it uses the captured data to update its output only after a delay, so that second clock domain 12 is able to capture a result that depends on the old data, irrespective of timing differences between clocks CLK1, CLK2.

When the embodiments of FIG. 2 and FIG. 7 are compared, it may be noted that the embodiment of FIG. 2 gives more room for timing differences (effectively over a full clock cycle) than the embodiment of FIG. 7 (which can tolerate effectively only part of a clock cycle between opposite edges of the clock signal).

Although the invention has been illustrated using specific embodiments, it should be realized that the invention is not limited to these embodiments are possible. For example although only two clock domains has been shown, it should be realized that in a practical circuit more than two clock domains may be used and that in each signal connection between respective clock domains a normally transparent test circuit block 14 may be inserted. It should be appreciated that this is possible without further measures, because the invention does not require qualitatively different clock signals in different clock domains (i.e. clock signals wherein different clock pulses are suppressed).

Furthermore, it should be realized that typically a clock domain 10 may have a plurality of outputs coupled to another clock domain or clock domains. In this case preferably a plurality of normally transparent test circuit blocks as shown in one or more of the embodiments is provided. These normally transparent test circuit blocks may be coupled in a single scan chain for the clock domain, which may also include scan cells from inside the clock domain. The scan cells and normally transparent test circuit blocks may be arranged in any order in the scan chain. Alternatively, they may be arranged in a plurality of parallel scan chains, again in any combination.

Furthermore, it should be appreciated that variations are possible in the normally transparent test circuit block 14. For example, latch 24 could be moved to the output of transparency multiplexer 26. However, this has the disadvantage that the delay during normal functional operation increases slightly.

As another example, the first multiplexer input of transparency multiplexer 26 may be coupled to the data input of normally transparent test circuit block 14, instead of to the output of scan multiplexer 20. This reduces the delay during normal operation. However, the connection as described for FIG. 2 has the advantage that an additional configuration is possible, wherein the connection for supplying data to transparency multiplexer 26 can be tested. In this configuration scan multiplexer 20 is made to pass shift data and transparency multiplexer 26 is made to pass data from scan multiplexer. Thus, scan flip-flop 22 and latch 24 are bypassed. In this configuration test data is shifted through the scan chain to test the connection to transparency multiplexer 26.

Furthermore, although embodiments have been shown wherein the scan input of the next scan cell in the scan chain after normally transparent test circuit block 14 is connected to the output of transparency multiplexer 26, it should be appreciated that alternatively this scan input may be coupled to the output of latch 24 (the input of transparency multiplexer 26) or the output scan flip-flop 22 (the input of latch 24). If the scan input is coupled before the input of latch 24, this latch 24 is automatically bypassed during shifting, so that shifting is not affected by delays through latch 24. In this case, latch 24 may be controlled simply with clock CLK1 independent of the shift enable signal SE. Also latch 24 may be replaced by a flip-flop that is clocked in phase opposition to scan flip-flop 22 in this case. However, not taking the scan output from the output of transparency multiplexer may make it more difficult to test the connection to transparency multiplexer 26. It may be noted that, when the scan chain does not receive data via transparency multiplexer 26, this transparency multiplexer 26 may be switched to interrupt the direct connection between clock domains (10, 12) at any time: this may be done at the start of test operations (before test data is shifted through the scan chain) or only once the test normal mode is entered.

Furthermore, although embodiments have been shown wherein the delay between sampling of a test result by scan flip-flop 22 and output of that test result by transparency multiplexer 26 is determined by mutually opposite transitions in the clock signal (CLK1 or CLKTST) it should be understood that alternatively a delay circuit may be included in the normally transparent test circuit block to control this delay. As another alternative latch 24 may be replaced by an asynchronous delay circuit (e.g. a chain of inverters) that is selectively activated during the test normal mode (e.g. by using a multiplexer to select the output of scan flip-flop directly or via the delay circuit). However, it is preferred to control the delay between sampling of a test result by scan flip-flop 22 and output of the test result at the output of transparency multiplexer 26 by means of the clock signal. This has the advantage that is does not affect the allowable range of clock frequencies. Moreover, although preferred embodiments have been shown wherein substantially no delay remains during shifting, it should be realized that alternatively some delay may remain even during shifting, as long as this delay does not impair shifting.

The invention claimed is:

1. A test prepared integrated circuit comprising
   a first and second clock domain, comprising a first functional circuit with a functional output and second functional circuit with a functional input respectively;
   a scan chain comprising a scan cell with a data input and a data output, the data input being coupled to the functional output of the first functional circuit; —a transparency multiplexer with a first and second multiplexed input and an output, the first and second multiplexer input being coupled to the functional output of the first functional circuit and the data output respectively, the output being coupled to the functional input of the second functional circuit; —a delay circuit coupled in series with the transparency multiplexer between the data output and the functional input.

2. A test prepared integrated circuit according to claim 1, wherein the delay circuit is switchable between a first and second mode, wherein a first delay and a second delay or substantially no delay are realized respectively, dependent on whether the scan chain is in a test normal mode wherein test results are captured or a shift mode wherein test data is shifted respectively.

3. A test prepared integrated circuit according to claim 1, wherein the delay circuit comprises a transparent/hold latch in series with the transparency multiplexer, and a control input coupled to a clock input of the scan cell, the latch being arranged to switch to a hold mode during a clock pulse for updating data in the scan cell.

4. A test prepared integrated circuit according to claim 3, wherein the delay circuit is switchable between a first and second mode, wherein a first delay and a second delay or substantially no delay are realized respectively, dependent on whether the scan chain is in a test normal mode wherein test results are captured or a shift mode wherein test data is shifted respectively, the latch being arranged to switch to a hold mode during a clock pulse only for clock pulses that occur while the scan chain is in the test normal mode.

5. A test prepared integrated circuit according to claim 3, comprising a test control circuit, having a first test clock output for supplying a first test clock signal to the first clock domain and a second test clock output for supplying a second test clock to the scan cell and the control input of the delay circuit, timed so that the scan cell is updated and the latch is set to hold before the first test clock causes an update in the first clock domain and the update is completed before the second clock signal switches the latch back to transparent.

6. A test prepared integrated circuit according to claim 1, wherein the scan cell comprises
   a scan multiplexer with a first and second multiplexed input and an output, the first and second multiplexed input being coupled to the data input and a preceding scan cell in the scan chain respectively;
   a scan flip-flop with an input coupled to the multiplexed output of the scan multiplexer and an output coupled to the data output; via the series arrangement of the delay circuit and the transparency multiplexer; —wherein the first multiplexed input of the transparency multiplexer is coupled to the functional output of the first functional circuit via the output of the scan multiplexer and wherein a scan input of a next following scan cell after the scan cell in the scan chain is coupled to the output of the transparency multiplexer.

7. A test prepared integrated circuit according to claim 1, wherein the delay circuit is coupled between the output of the scan cell and the second multiplexed input of the transparency multiplexer.

8. A method of testing an integrated circuit that comprises a plurality of clock domains using a scan chain, the method comprising
    switching the integrated circuit to a test mode, wherein a connection is interrupted between a functional output of a first one of the clock domains and a functional input of a second one of the clock domains;
    applying a part of test data from the scan chain to the functional input from a scan cell;
    capturing a test response to the test data from the functional output into the scan cell;
    using a delay circuit to delay transfer of the test result from the scan cell to the functional input when the test result is captured in the scan cell;
    shifting the test result through the scan chain.

9. A method according to claim 8, comprising at least one of the following:
    using less delay of transfer from the scan cell during shifting than during capture, or no delay;
    using an extended clock cycle, or a skipped clock pulse before resumption of shifting after capture.

10. A method according to claim 8, comprising
    keeping the delay circuit active during shifting;
    using mutually different clocks for said first clock domain and the scan cell, timed so that the scan cell is updated and a latch at the output of the scan cell is set to hold before the clock of the first clock domain causes an update in the first clock domain and the update is completed before the second clock signal switches the latch back to transparent.

* * * * *